(12) United States Patent
Skalski

(10) Patent No.: US 10,383,263 B2
(45) Date of Patent: Aug. 13, 2019

(54) INVERTER CAPACITOR SYSTEM HAVING INTERNAL COOLING CHANNEL

(71) Applicant: Ford Global Technologies, LLC, Dearborn, MI (US)

(72) Inventor: Vincent T Skalski, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 115 days.

(21) Appl. No.: 15/806,837

(22) Filed: Nov. 8, 2017

(65) Prior Publication Data

US 2019/0141865 A1 May 9, 2019

(51) Int. Cl.
| | |
|---|---|
| *H05K 7/20* | (2006.01) |
| *H01G 11/10* | (2013.01) |
| *H01G 11/18* | (2013.01) |
| *H01G 9/00* | (2006.01) |
| *H01G 9/26* | (2006.01) |
| *H01G 11/80* | (2013.01) |
| *H01G 9/10* | (2006.01) |
| *H02M 7/00* | (2006.01) |
| *H02P 27/06* | (2006.01) |
| *B60L 11/00* | (2006.01) |
| *B60K 11/02* | (2006.01) |
| *F28F 3/02* | (2006.01) |
| *H05K 5/06* | (2006.01) |

(52) U.S. Cl.
CPC .......... *H05K 7/20927* (2013.01); *B60K 11/02* (2013.01); *B60L 11/005* (2013.01); *F28F 3/022* (2013.01); *H01G 9/0003* (2013.01); *H01G 9/10* (2013.01); *H01G 9/26* (2013.01); *H01G 11/10* (2013.01); *H01G 11/18* (2013.01); *H01G 11/80* (2013.01); *H02M 7/003* (2013.01); *H02P 27/06* (2013.01); *H05K 5/064* (2013.01); *B60Y 2306/05* (2013.01); *F28F 2230/00* (2013.01)

(58) Field of Classification Search
CPC .... H05K 7/20927; H05K 5/064; B60K 11/02; B60L 11/005; F28F 3/022; F28F 2230/00; H01G 9/0003; H01G 9/10; H01G 9/26; H01G 11/10; H01G 11/18; H01G 11/90; H02M 7/003; H02P 27/06; B60Y 2306/05
See application file for complete search history.

(56) References Cited

U.S. PATENT DOCUMENTS

| | | |
|---|---|---|
| 7,978,471 B2 | 7/2011 | Tokuyama et al. |
| 8,064,234 B2 | 11/2011 | Tokuyama et al. |
| 8,228,660 B2 | 7/2012 | Fujii et al. |
| 8,336,657 B2 | 12/2012 | Dobbins et al. |
| 9,087,418 B2 | 7/2015 | Luedtke et al. |
| 9,445,532 B2 | 9/2016 | Chen et al. |

(Continued)

FOREIGN PATENT DOCUMENTS

KR    20090050118 A    5/2009

*Primary Examiner* — Robert L Deberadinis
(74) *Attorney, Agent, or Firm* — David Kelley; Brooks Kushman P.C.

(57) ABSTRACT

An inverter system control (ISC) module is provided. The ISC module includes a power module defining a coolant channel for receiving a coolant, and a capacitor assembly disposed adjacent to the power module. The capacitor assembly includes a housing, a potting material disposed within the housing, and a plurality of power sources disposed within the potting material. The capacitor assembly further includes a cooling bar extending within the potting material between the power sources, and further extending out of the potting material and into the power module.

20 Claims, 8 Drawing Sheets

(56) References Cited

U.S. PATENT DOCUMENTS

| | | |
|---|---|---|
| 9,515,357 B2 | 12/2016 | Haskins et al. |
| 9,742,275 B2 | 8/2017 | Chen |
| 2014/0132382 A1 | 5/2014 | Zarei et al. |
| 2016/0303995 A1 | 10/2016 | Lei et al. |
| 2016/0309624 A1 | 10/2016 | Lei et al. |
| 2017/0033704 A1 | 2/2017 | Lei et al. |
| 2017/0197511 A1 | 7/2017 | Yonak et al. |
| 2017/0222641 A1 | 8/2017 | Zou et al. |
| 2017/0245401 A1 | 8/2017 | Yonak et al. |

INVERTER CAPACITOR SYSTEM HAVING INTERNAL COOLING CHANNEL

TECHNICAL FIELD

The present disclosure relates generally to hybrid electric vehicles having an inverter system controller module as part of their powertrain, and more specifically to systems and methods for cooling an inverter system controller module.

BACKGROUND

Hybrid electric vehicles (HEVs), plug-in hybrid electric vehicles (PHEVs), battery electric vehicles (BEVs), fuel cell vehicles, and other known electrified vehicles differ from conventional motor vehicles in that they are powered by one or more electric machines (i.e., electric motors and/or generators) instead of or in addition to an internal combustion engine. High voltage current is typically supplied to the electric machines by one or more batteries that store electrical power.

Several types of electric/hybrid powertrains include an inverter system controller module (ISCM) which converts high voltage DC power stored in a battery into high voltage AC power used by the electric machines in the electric/hybrid transmission. In general, the amount of heat generated by ISCMs increases with increased power output of the devices. Therefore, thermal management of the heat generated by ISCMs assembly may become necessary.

SUMMARY

In at least one approach, an inverter system is provided. The inverter system may include a power module defining a coolant channel for receiving a coolant. The inverter system may further include a capacitor assembly disposed adjacent to the power module. The capacitor assembly may include a housing, a potting material disposed within the housing, and a plurality of power sources disposed within the potting material. The inverter system may further include a cooling bar extending within the potting material between the power sources, and further extending out of the potting material and into the power module. The capacitor assembly may include (N−2)/2 cooling bars, wherein N is a number of power sources disposed within the potting material.

In at least one approach, the cooling bar may define a hollow tube extending through a wall of the power module and into a coolant channel of the power module.

In at least another approach, the cooling bar may be a multiple component cooling bar including a tube extending within the potting material and defining a tube tip extending out of the potting material, and a coolant tip secured to the tube tip. The coolant tip may extend through a wall of the power module and into a coolant channel of the power module.

In at least one approach, the cooling bar may extend through a wall of the power module and into a coolant channel of the power module. The cooling bar may define a tip portion disposed within the coolant channel, and the tip portion may define a plurality of spaced apart, elongated fins. The tip portion may define an array of at least four spaced apart, elongated fins.

At least a portion of the cooling bar may extend within the potting material defines a hollow tube having a first cavity. In at least one approach, the tip portion may define a hollow tip portion having a second cavity in fluid communication with the first cavity. In at least another approach, the tip portion may be a substantially solid tip portion free of internal cavities.

In at least one approach, an inverter system control module may include a power module adapted to receive a coolant and a capacitor assembly adjacent the power module. The capacitor assembly may include capacitor cells disposed within a potting material and a cooling bar. The cooling bar may include first and second tips extending through a wall of the power module and defining first and second openings. The cooling bar may further include a hollow body extending between the first and second tips and at least partially within the potting material.

The first tip may be a coolant receiving tip and the second tip may be a coolant expelling tip disposed downstream of an expected coolant flow path. The first and second openings of the first and second tips may be adapted to permit fluid communication between a coolant channel of the power module and the hollow body.

The hollow body may define an intake tube portion having a first central axis, an intermediate tube portion having a second central axis angularly offset from the first central axis, and an output tube portion having a third central axis angularly offset from the second central axis and substantially parallel to the first central axis.

The intake tube portion and the output tube portion may be disposed in contact with the potting material. The intermediate tube portion may not be in contact with the potting material.

The cooling bar may be a multiple discrete component cooling bar. The first tip may be rigidly secured to the intake tube portion and the second tip may be rigidly secured to the output tube portion.

In at least one approach, an electrified vehicle includes a DC power supply configured to provide power for an electric drive system of a vehicle, and an inverter system control (ISC) circuit coupled to, and configured to receive DC power from, the power supply. The ISC circuit may include a power module defining a coolant channel for receiving a coolant, and a capacitor assembly disposed adjacent to the power module. The capacitor assembly may include a housing, a potting material disposed within the housing, a plurality of power sources disposed within the potting material, and a cooling bar extending within the potting material between the power sources, and further extending out of the potting material and into the power module.

The potting material may include a thermally conductive, electrically insulating material. The power sources may include capacitor cells. The capacitor assembly may include at least one of an input capacitor and a DC-link capacitor. The cooling bar may be a multiple component cooling bar including a tube extending within the potting material and defining a tube tip extending out of the potting material, and a coolant tip secured to the tube tip. The coolant tip may extend through a wall of the power module and into a coolant channel of the power module.

The cooling bar may extend through a wall of the power module and into a coolant channel of the power module. The cooling bar may define a tip portion disposed within the coolant channel. The tip portion may define a plurality of spaced apart, elongated fins.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
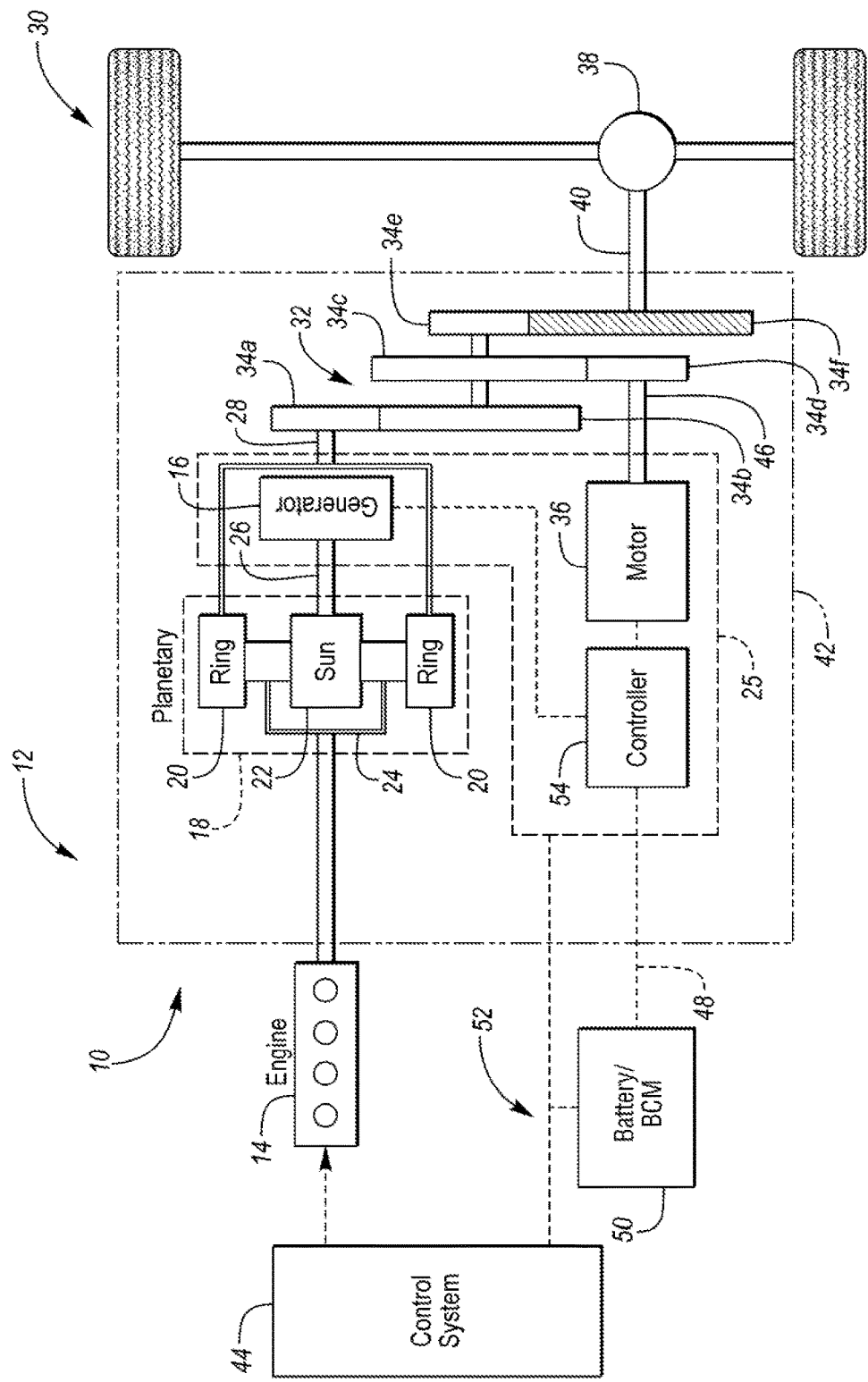
FIG. 1 schematically illustrates a powertrain of an electrified vehicle.

FIG. 1 schematically illustrates a powertrain 10 for an electrified vehicle 12, such as a HEV. Although depicted as a HEV, it should be understood that the concepts described herein are not limited to HEVs and could extend to other electrified vehicles, including but not limited to, PHEVs, BEVs, and fuel cell vehicles.

In one approach, the powertrain 10 is a power split system that may employ a first drive system that includes a combination of an engine 14 and a generator 16 (i.e., a first electric machine) and a second drive system that includes at least a motor 36 (i.e., a second electric machine), the generator 16, and a power pack 50. For example, the motor 36, the generator 16, and the power pack 50 may make up an electric drive system 25 of the powertrain 10. The first and second drive systems may generate torque to drive one or more sets of vehicle drive wheels 30 of the electrified vehicle 12.

The engine 14, such as an internal combustion engine, and the generator 16 may be connected through a power transfer unit 18. In one non-limiting approach, the power transfer unit 18 is a planetary gear set. Of course, other types of power transfer units, including other gear sets and transmissions, may be used to connect the engine 14 to the generator 16. The power transfer unit 18 may include a ring gear 20, a sun gear 22 and a carrier assembly 24. The generator 16 may be driven by the power transfer unit 18 when acting as a generator to convert kinetic energy to electrical energy. The generator 16 can alternatively function as a motor to convert electrical energy into kinetic energy, thereby outputting torque to a shaft 26 connected to the carrier assembly 24 of the power transfer unit 18. Because the generator 16 may be operatively connected to the engine 14, the speed of the engine 14 can be controlled by the generator 16.

The ring gear 20 of the power transfer unit 18 may be connected to a shaft 28 that is connected to vehicle drive wheels 30 through a second power transfer unit 32. The second power transfer unit 32 may include a gear set having a plurality of gears 34A, 34B, 34C, 34D, 34E, and 34F. Other power transfer units may also be suitable. The gears 34A-34F may transfer torque from the engine 14 to a differential 38 to provide traction to the vehicle drive wheels 30. The differential 38 may include a plurality of gears that enable the transfer of torque to the vehicle drive wheels 30. The second power transfer unit 32 may be mechanically coupled to an axle 40 through the differential 38 to distribute torque to the vehicle drive wheels 30.

The motor 36 can also be employed to drive the vehicle drive wheels 30 by outputting torque to a shaft 46 that is also connected to the second power transfer unit 32. In one embodiment, the motor 36 and the generator 16 may be part of a regenerative braking system in which both the motor 36 and the generator 16 can be employed as motors to output torque. For example, the motor 36 and the generator 16 can each output electrical power to a high voltage bus 48 and the power pack 50. The power pack 50 may be a high voltage battery that is capable of outputting electrical power to operate the motor 36 and the generator 16. Other types of energy storage devices and/or output devices can also be incorporated for use with the electrified vehicle 12.

The motor 36, the generator 16, the power transfer unit 18, and the power transfer unit 32 may generally be referred to as a transaxle 42, or transmission, of the electrified vehicle 12. Thus, when a driver selects a particular shift position, the transaxle 42 may be appropriately controlled to provide the corresponding gear for advancing the electrified vehicle 12 by providing traction to the vehicle drive wheels 30.

The powertrain 10 may additionally include a control system 44 for monitoring and/or controlling various aspects of the electrified vehicle 12. For example, the control system 44 may communicate with the electric drive system 25, the power transfer units 18, 32 or other components to monitor and/or control the electrified vehicle 12. The control system 44 may include electronics and/or software to perform the necessary control functions for operating the electrified vehicle 12. In one approach, the control system 44 may be a combination vehicle system controller and powertrain control module (VSC/PCM). Although it is shown as a single hardware device, the control system 44 may include multiple controllers in the form of multiple hardware devices, or multiple software controllers within one or more hardware devices.

A controller area network (CAN) 52 may allow the control system 44 to communicate with the transaxle 42. For example, the control system 44 may receive signals from the transaxle 42 to indicate whether a transition between shift positions is occurring. The control system 44 could also communicate with a battery control module of the power pack 50, or other control devices.

Additionally, the electric drive system 25 may include one or more controllers 54, such as an inverter system controller (ISC). The controller 54 may be configured to control specific components within the transaxle 42, such as the generator 16 and/or the motor 36, such as for supporting bidirectional power flow. In one embodiment, the controller 54 is an inverter system controller combined with a variable voltage converter (ISC/VVC).

Figure 2:
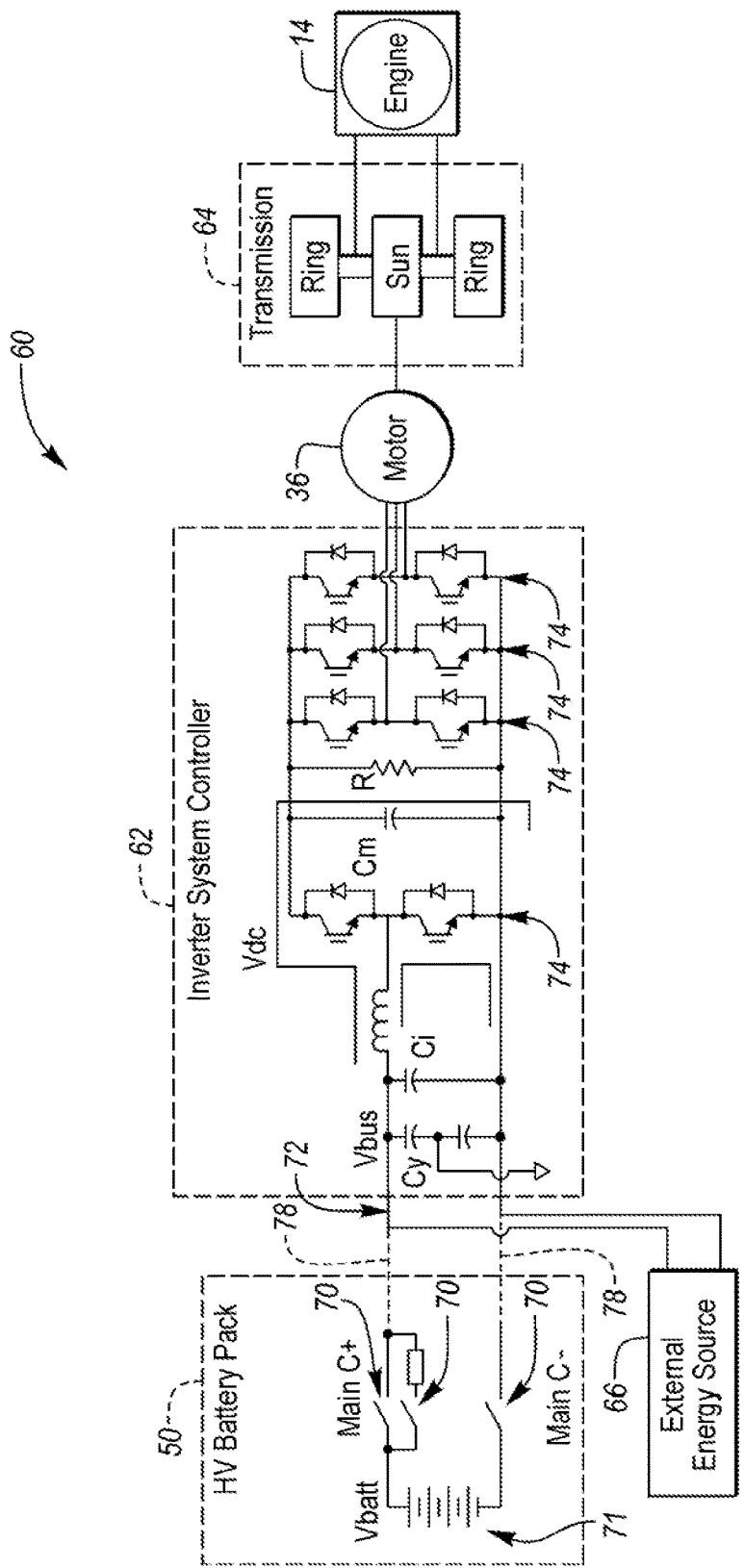
FIG. 2 schematically illustrates an exemplary battery control system.

FIG. 2 illustrates an exemplary battery control system 60. The battery control system 60 may include the power pack 50, an inverter system controller (ISC) 62, the motor 36, a transmission 64, and the engine 14. The battery control system 60 additionally may be in electrical communication with an external energy source 66.

The power pack 50 may include one or more power sources 71 and contactors 70. The contactors 70 may be selectively opened/closed to disconnect/connect the power sources 71 of the power pack 50 to a high voltage bus 72. For example, the contactors 70 may be selectively closed to apply the DC voltage from the power pack 50 to the high voltage bus 72, and may be selectively opened to disconnect the power pack 50 from the high voltage bus 72. In at least one approach, the contactors 70 may be controlled by a control module (not shown), such as a battery energy control module (BECM). In at least one approach, a high voltage cable 78 may connect the power pack 50 to the ISC 62.

In at least one approach, the ISC 62 may be an inverter system controller combined with a variable voltage converter. The ISC 62 may include a plurality of switching devices 74 for controlling bi-directional power flow within the battery control system 60. In at least one approach, the switching devices 74 may be insulated-gate bipolar transistors (IGBTs). The switching devices 74 may be selectively commanded to undergo switching operations for converting DC voltage from the power pack 50 to three phase AC voltage for supplying power to the motor 36 (i.e., to propel the vehicle), or alternatively, to covert AC three phase voltage to DC voltage for electric regenerative charging the power sources 71 of the power pack 50.

The transmission 64 may include the gear systems necessary for utilizing the power from the motor 36 to start the engine 14 during vehicle starting conditions. The transmission 64 may also transfer the power from the engine 14 to the motor 36 for regeneratively charging the power pack 50.

The external energy source 66 may be a separate component from the electrified vehicle. In at least one approach, the external energy source 66 may be a lead acid battery charger. In at least another approach, the external energy source 66 may be a low voltage battery. Other external energy sources are also contemplated within the scope of this disclosure.

Figure 3:
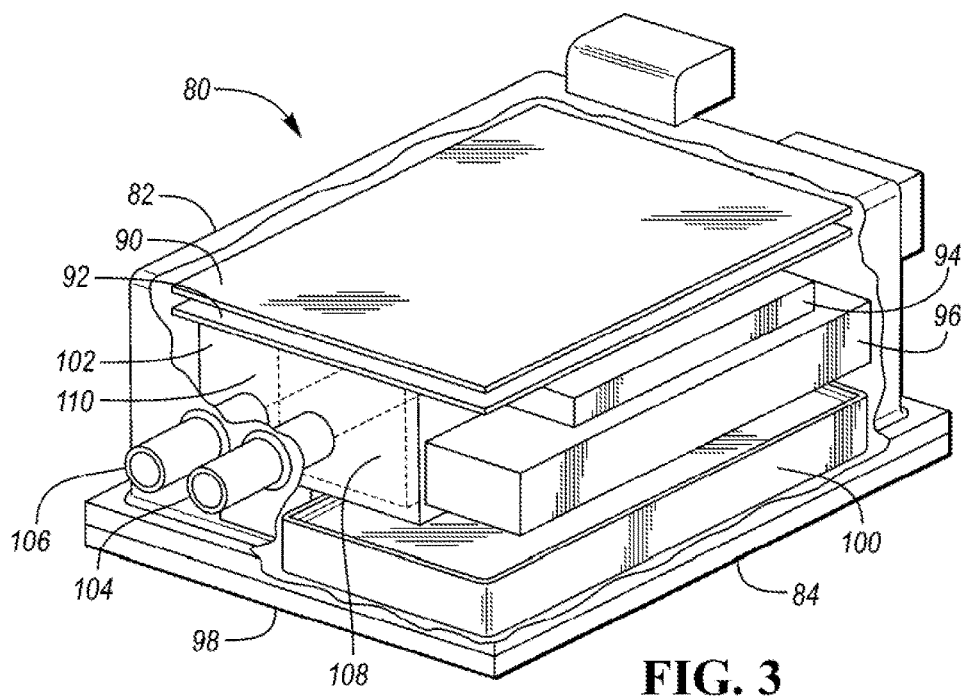
FIG. 3 is a perspective view of an exemplary inverter system controller module.

Referring now to FIG. 3, an inverter system controller (ISC) module 80 may include a housing 82. In at least one approach, the housing 82 may be secured to a base plate 84 to define a cavity therebetween. In at least another approach, the housing 82 may be secured to another vehicle component (such as a transmission housing) to define a cavity therebetween.

The ISC module 80 may further include a control board 90 and a gate drive board 92. In at least one approach, the boards 90 may separately formed. In at least another approach, the board 90, 92 may be formed as a single unit.

In at least one approach, the ISC module 80 may further include an inductor 94. In at least another approach, such as in many BEV implementations, the ISC module 80 may not include the inductor 94.

The ISC module 80 may further include a discharge resistor 96. In at least one approach, the discharge resistor 96 may include an overmolded bus bar assembly. In at least another approach, an overmolded bus bar assembly may be separately provided. The ISC module 80 may further include a current sensor 98.

The ISC module 80 may further a capacitor assembly 100. The capacitor assembly 100 may be an input capacitor, a DC-link capacitor, or a combination of an input capacitor and DC-link capacitor. In still another approach, the ISC module 80 may include multiple capacitor assemblies 100. In this way, a first capacitor assembly may be an input capacitor, and a second capacitor assembly may be a DC-link capacitor. In one example, a dual ISC (such as a PHEV/FHEV vehicle) may include a VVC inductor and may contain both an input capacitor and a DC-link capacitor. In another example, a vehicle such as a BEV vehicle may be provided with a DC-link capacitor, and a VVC inductor may be omitted.

The input capacitor assembly 100 may be disposed in proximity to a power module 102. The power module 102 may include a first opening 104 and a second opening 106. The power module 102 may define one or more internal cavities, such as a supply chamber 108 and a return chamber 110. The chambers 108, 110 may be adapted to permit the passage of coolant therethrough. In this way, chambers 108, 110 may be referred to as coolant channels. The chambers 108, 110 may be on opposite sides of the divider. In the approach illustrated in FIG. 3, the supply chamber 108 and the return chamber 110 are positioned side-by-side; however, other configurations are contemplated. The supply chamber 108 may include a port that connects with a supply line, and the return chamber 110 may include a port that connects with a return line. The supply and return lines may form part of a larger thermal management system that may include pumps, radiators, other lines, valves, and other components.

During operation, pressurized coolant may be provided to the supply chamber 108 to cool the power module 102. The coolant may pass through the return chamber 110 to exit the power module 102. The divider may help ensure that the coolant flows through the power module 102 before exiting through the return chamber 110.

Figure 4:
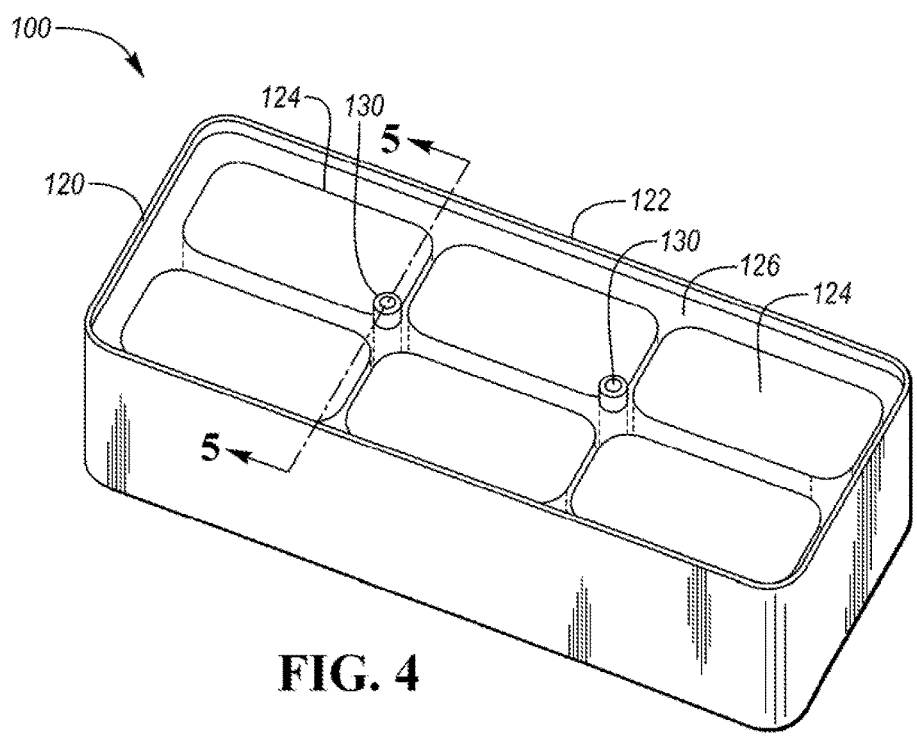
FIG. 4 is a perspective view of an exemplary capacitor assembly.

Referring now to FIG. 4, a capacitor assembly 100 may include a housing 120 defining a top surface 122, which may define a top plane of the capacitor assembly 100. The capacitor assembly 100 may further include one or more power sources 124. In at least one approach, the power sources 124 may be capacitor cells, and may form a capacitor bank within the housing 120. A capacitor cell may be of any suitable type, such as an ultra capacitor, super capacitor, electrochemical capacitor, or electronic double layer capacitor.

In at least one approach, the power sources 124 may be other electrical power sources such as a battery having a plurality of electrically interconnected cells, or fuel cells. If a battery is used, it may be of any suitable type, such as nickel-metal hydride (Ni—MH), nickel-iron (Ni—Fe), nickel-cadmium (Ni—Cd), lead acid, zinc bromine (Zn—Br), or lithium based. In at least one approach, a battery can be used in conjunction with one or more capacitors.

The housing 120 may be filled with a potting material 126. The potting material 126 may be a thermally conductive, electrically insulating material, such as an epoxy, resin, or adhesive. The potting material 126 may secure and protect the power sources 124. Alternatively, the potting material 126 may be the housing 120.

In some approaches, high temperatures can cause a capacitor to breakdown at a lower voltage level. High temperatures can also adversely affect a capacitor's electrical performance and shorten its lifetime.

In this way, the input capacitor assembly 100 may be provided with at least one cooling bar 130. The cooling bar 130 may be a thermally conductive material such as metal. The cooling bar 130 may extend within the potting material 126 and between the power sources 124. The cooling bar 130 may also extend out of the potting material 126, and may extend above the top surface 122 of the housing 120. The number of cooling bars 130 can be selected as a function of the number of power sources 124. For example, the capacitor assembly 100 may be provided with (N−2)/2 cooling bars 130, wherein N is an even value representing the quantity of power sources 124 disposed within the potting material 126. In the approach shown in FIG. 4, the capacitor assembly 100 is provided with 2 cooling bars 130 and 6 power sources 124.

Figure 5:
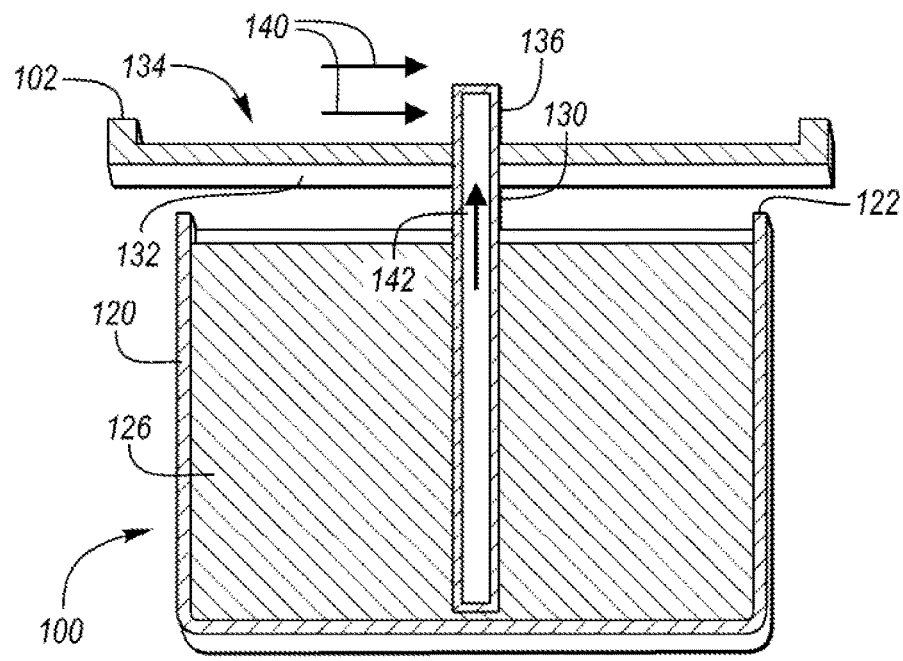
FIG. 5 is a side elevation section view of the capacitor assembly of FIG. 4.

The extension of the cooling bar 130 within the potting material 126 and out of the potting material—and above the top surface 122 of the housing 120—can be seen in FIG. 5. In at least one approach, the cooling bar 130 may extend through a wall 132 of the power module and into a coolant channel 134 (which may correspond to the supply chamber 108 shown in FIG. 3) of the power module 102.

In the approach shown in FIG. 5, the cooling bar 130 defines a hollow tube defining an interior cavity. The cooling bar 130 extends upwardly from the inductor assembly 100, through the wall 132 of the power module 102, and into the coolant channel 134 of the power module 102. In this way, coolant flowing through the coolant channel 134 (as indicated by arrows 140) may cool a coolant tip 136 of the cooling bar 130. The cooling bars 130 may therefore effect a heat transfer between the potting material 126 and the coolant passing through the coolant channel 134 (as indicated by arrow 142).

Although shown in FIG. 5 as a hollow tube defining an interior cavity, in still another approach, the cooling bar 130 may be a solid cooling bar free of an interior cavity.

Figure 6:
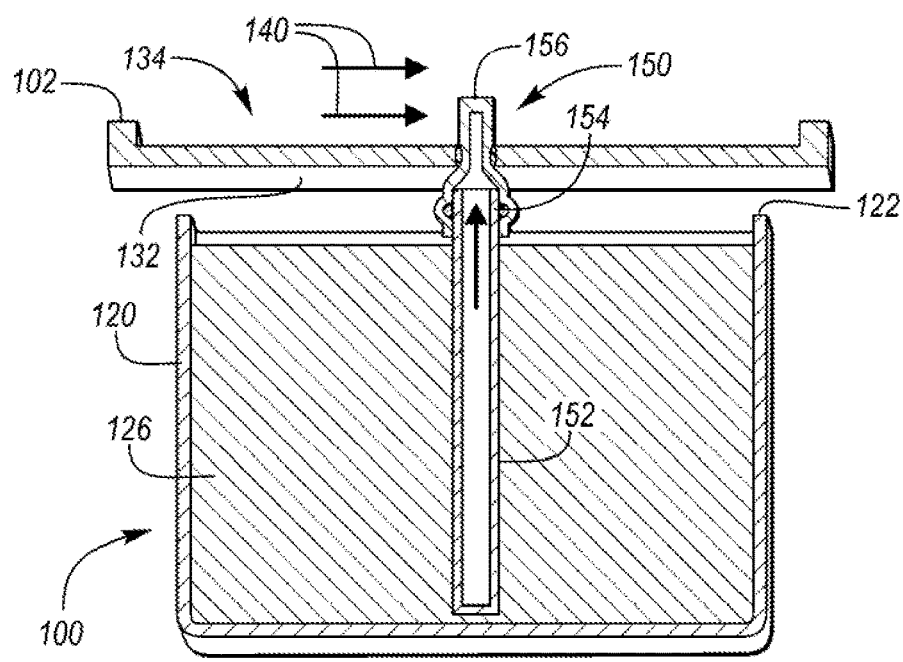
FIG. 6 is a side elevation section view of another capacitor assembly.

Referring to FIG. 6, in still another approach, a cooling bar 150 may be a multiple component cooling bar. The cooling bar 150 may include a tube portion 152 extending within the potting material 126 and defining a tube tip 154 extending out of the potting material 126. The cooling bar 150 may further include a coolant tip 156 secured to the tube tip 154. The coolant tip 156 may extend through the wall 132 of the power module 102 and into a coolant channel 134 of the power module 102.

The coolant tip 156 may be secured to the tube tip 154 in any suitable manner. In at least one approach, the coolant tip 156 may be secured to the tube tip 154 through an interference fit (e.g., press-fit, snap-fit) engagement. In still another approach, the tube tip 154 and the coolant tip 156 may be provided with complementary threaded regions to permit a threaded engagement between the tube tip 154 and the coolant tip 156.

The coolant tip 156 may similarly be secured to the wall 132 of the power module 102 through an interference fit (e.g., press-fit, snap-fit) engagement. In still another approach, the walls 132 (e.g., at an aperture of the wall 132) and the coolant tip 156 may be provided with complementary threaded regions to permit a threaded engagement between the wall 132 and the coolant tip 156.

Figure 7:
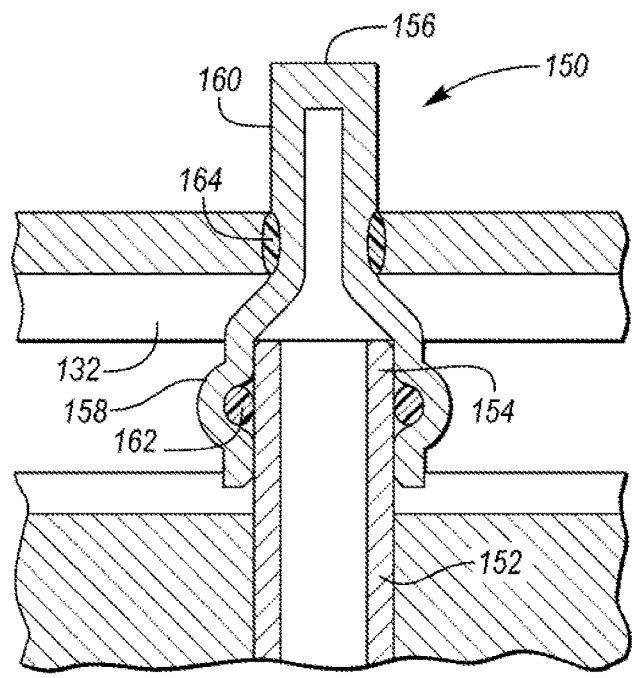
FIG. 7 is an enlarged view of the cooling bar of FIG. 6.

Referring to FIG. 7, the coolant tip 156 may include a bulbous region 158 disposed on a first side of the wall 132, and a protruding region 160 disposed on a second side of the wall 132. The bulbous region 158 may be provided with an inner diameter dimensioned larger than an outer diameter of the tube tip 154. In this way, the coolant tip 156 may be received within the bulbous region 158. In still another approach, the coolant tip 156 may be dimensioned to be received within an internal diameter of the tube tip 154.

In at least one approach, a seal 162 may be provided between the coolant tip 156 and the tube portion 152 (e.g., between the bulbous region 158 and the tube tip 154). Similarly, a seal 164 may be provided between the coolant tip 156 and the wall 132 of the power module 102 (e.g., between an aperture wall of the wall 132 and the protruding region 160 of the coolant tip 156). The seals 162, 164 may be formed of common materials or different materials. The seals 162, 164 may be, for example, elastomeric o-rings or RTV silicone seals.

Figure 8:
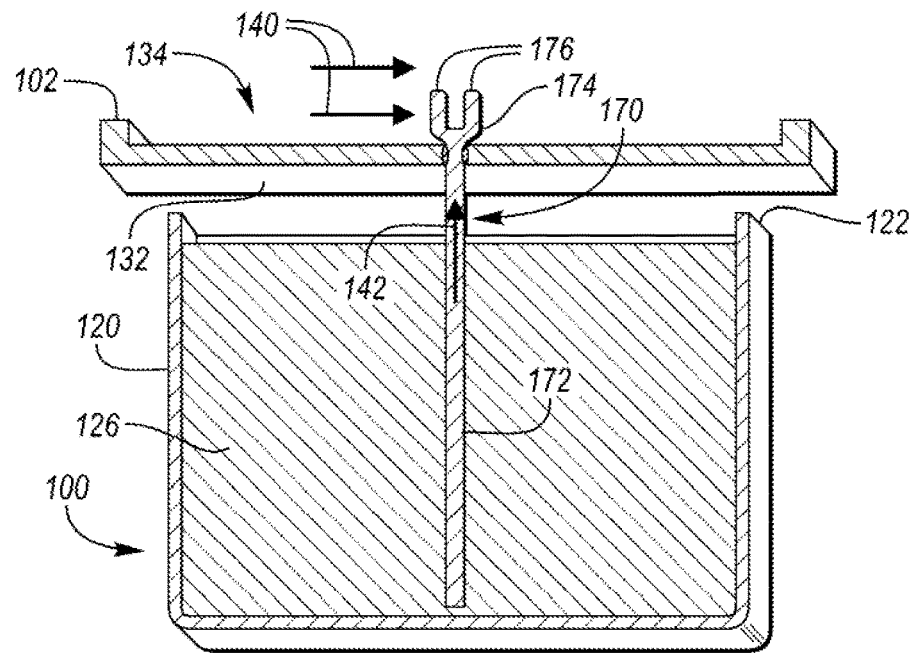
FIG. 8 is a side elevation section view of still another capacitor assembly.

Referring now to FIG. 8, a cooling bar 170 may be a one-piece, unitary, and integrally formed cooling bar 170. The cooling bar 170 may extend through a wall 132 of the power module 102 and into a coolant channel 134 of the power module 102. The cooling bar 170 may defines a body portion 172 extending within the potting material 126, extending out of the potting material 126, and extending through the wall 132. The cooling bar 170 may further include a tip portion 174 that may may be disposed in, and may extend within, a coolant channel 134 of the power module 102.

The tip portion 174 may define a plurality of spaced apart, elongated fins 176. In the approach shown in FIG. 8, the tip portion 174 may include two fins 176. In this way, the cooling bar 170 may be in the form of a fin bus bar.

The cooling bar 170 may be secured to the wall 132, and may further include one or more seals, as discussed with respect to cooling bar 150. Furthermore, the cooling bar 170 may effect a heat transfer between the potting material 126 and the coolant passing through the coolant channel 134 (as indicated by arrow 142).

Figure 9:
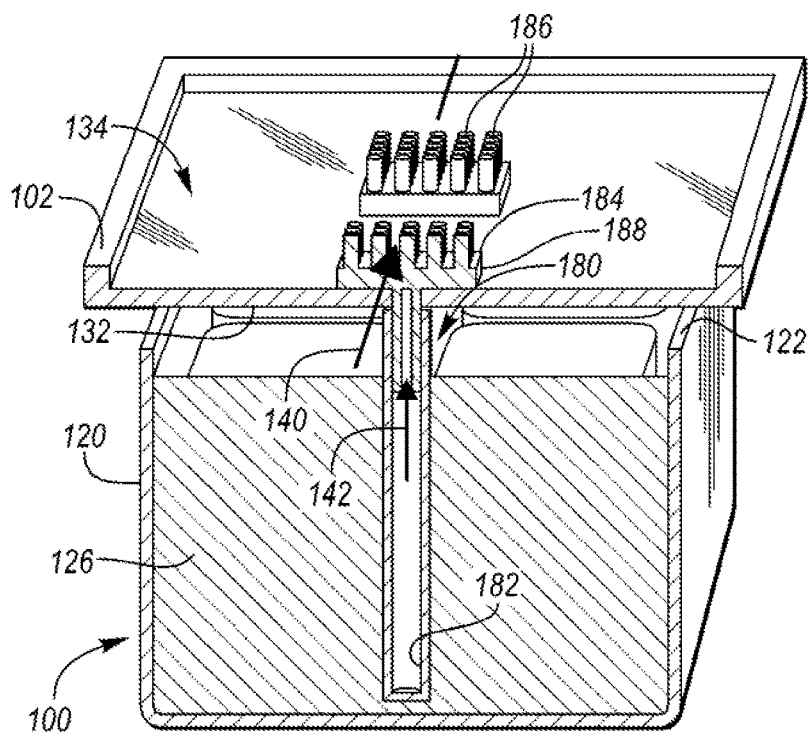
FIG. 9 is a side elevation section view of still another capacitor assembly.

Referring to FIG. 9, in still another approach, a cooling bar 180 may be a multiple component cooling bar. The cooling bar 180 may include a tube portion 182 extending within the potting material 126 and defining a tube tip portion 184 extending out of the potting material 126. The tube portion 182 may be a hollow tube portion defining an interior cavity, or may be a solid tube portion free of an internal cavity. The cooling bar 180 may further include a coolant tip 186 secured to the tube tip portion 184. The coolant tip 186 may extend through the wall 132 of the power module 102 and into a coolant channel 134 of the power module 102.

The tube tip portion 184 may define a plurality of spaced apart, elongated fins 186 extending from a plate region 188. More particularly, the tube tip portion 184 may define an array of at least four spaced apart, elongated fins 186. In this way, the cooling bar 170 may be in the form of a fin plate bar. In the approach shown in FIG. 9, the tube tip portion 184 may be a 5×5 array include twenty fins 176. However, any suitable array may be provided (e.g., 2×2, 3×3, 4×4, or 6×6 or more). Additionally, the array may be an asymmetric array having a first number of fins in a first direction and a second number of fins in a second direction, the second number being different than the first number.

In the approach shown in FIG. 9, the plate region 188 is a solid plate region free of an interior cavity. In the approach shown in FIG. 10, the plate region 188 is a hollow plate region defining an interior cavity 190. The interior cavity 190 may be in fluid communication with the interior cavity of the tube portion 182 of the cooling bar 180.

Figure 10:
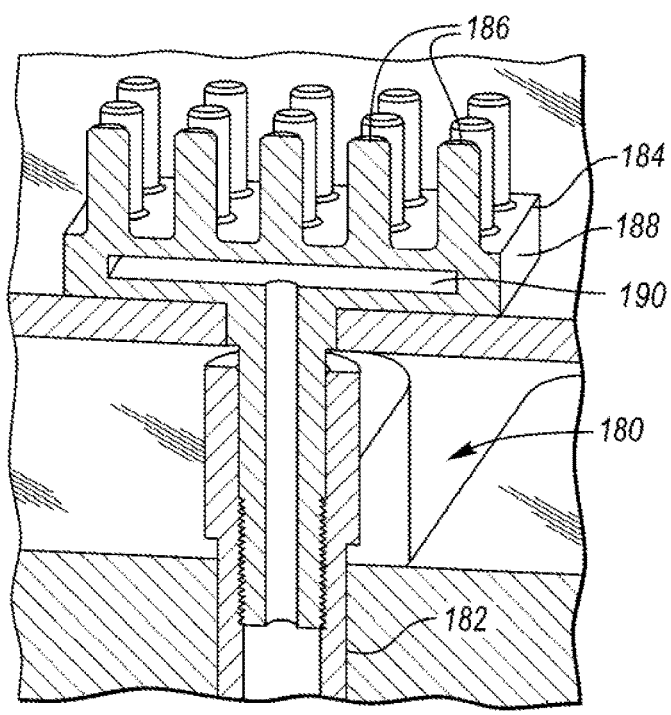
FIG. 10 is an enlarged view of an alternative cooling bar.
Figure 11:
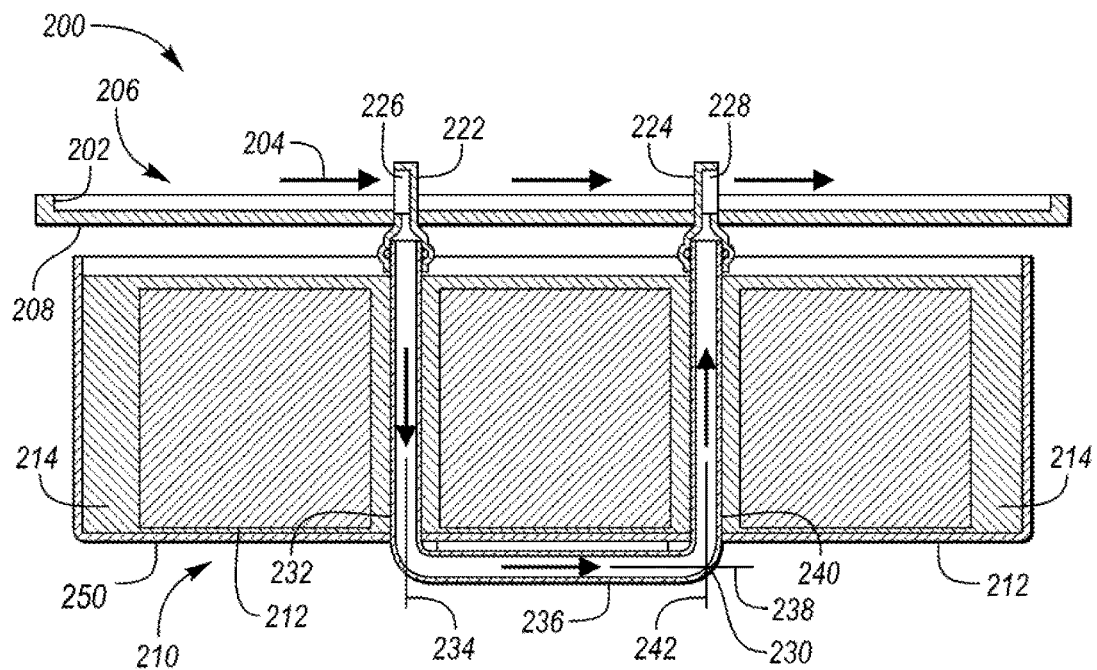
FIG. 11 is a side elevation section view of still another capacitor assembly.
Figure 12:
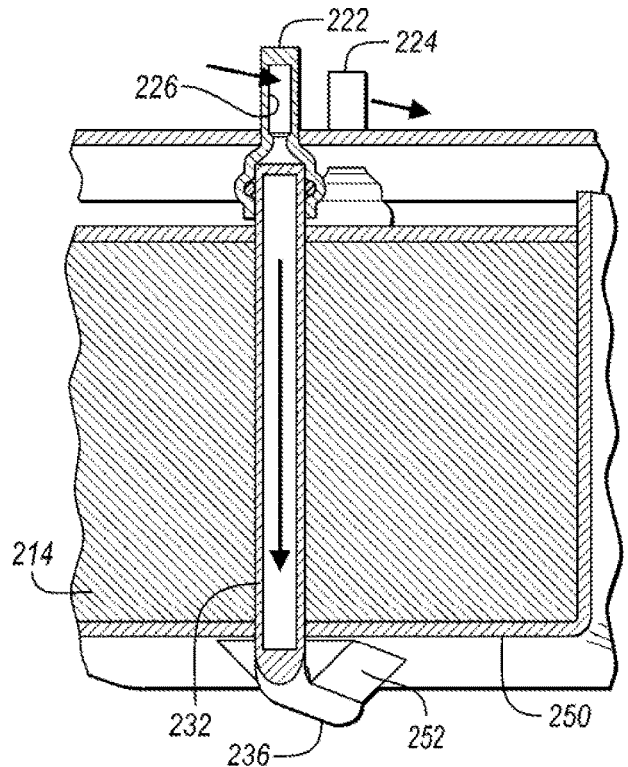
FIG. 12 is a side perspective section view of the capacitor assembly of FIG. 11.

Furthermore, as shown in FIG. 10, the tube portion 182 of the cooling bar 180 may be provided with one or more internal threads, and the Referring now to FIGS. 11 and 12, an inverter system controller (ISC) module 200 may include a power module 202 adapted to receive a coolant (as indicated by arrows 204) through a coolant channel 206 defined at least partially by a wall 208 of the power module 202.

A capacitor assembly 210 may be disposed adjacent the power module 202. The capacitor assembly 210 may include one or more capacitor cells 212 disposed within a potting material 214. The capacitor assembly 210 may also include one or more cooling bars 220. One or more of the cooling bars 220 may include a first tip 222 and a second tips 224. The first and second tips 222, 224 may extend through a wall 208 of the power module 202. The first and second tips 222, 224 may also define a first opening 226 and second opening 228.

In at least one approach, the first tip 222 may be a coolant receiving tip adapted to receive coolant in an expected coolant flow path (as indicated by arrows 204), and the second tip 224 may be a coolant expelling tip disposed downstream of the first tip 222 in the expected coolant flow path.

The capacitor assembly 210 may also include a hollow body 230 extending between the first and second tips 222, 224 and at least partially within the potting material 126. The first and second openings 226, 228 of the first and second tips 222, 224 may be adapted to permit fluid communication between the coolant channel 206 of the power module 202 and the hollow body 230.

In at least one approach, the hollow body 230 may define an intake tube portion 232 having a first central axis 234. The hollow body 230 may further define an intermediate tube portion 236 having a second central axis 238. The second central axis 238 may be angularly offset from the first central axis 234. For example, the second central axis 238 may be angularly offset from the first central axis 234 by an angle of approximately 90 degrees. The hollow body 230 may further define an output tube portion 240 having a third central axis 242. The third central axis 242 may be angularly offset from the second central axis 238. For example, the third central axis 242 may be angularly offset from the second central axis 238 by an angle of approximately 90 degrees. In this way, the third central axis 242 may be approximately parallel to the first central axis 234.

In at least one approach, the intake tube portion 232 and the output tube portion 240 may be disposed in contact with the potting material 214, and the intermediate tube portion 236 may not be in contact with the potting material 214. For example, the intermediate tube portion 236 may be disposed outside of a housing 250 of the capacitor assembly 210. More particularly, the intermediate tube portion 236 may be supported by support region 252 extending from the housing 250 of the capacitor assembly 210.

In still another approach, the intermediate tube portion 236 may be in contact with the potting material 214. In this approach, the intermediate tube portion 236 may extend within the housing 240 in contact with the potting material 214 in between the intake tube portion 232 and the output tube portion 240.

In at least one approach, the cooling bar 240 is formed of multiple discrete components. In this way, the first tip 222 may be rigidly secured to the intake tube portion 232, and the second tip 224 may be rigidly secured to the output tube portion 240. The multiple discrete component cooling bar 240 may have tip portions secured to body portions as described in various approaches elsewhere herein. In at least another approach, the first and second tips 222, 224 and the hollow body 230 are integrally formed.

Figure 13:
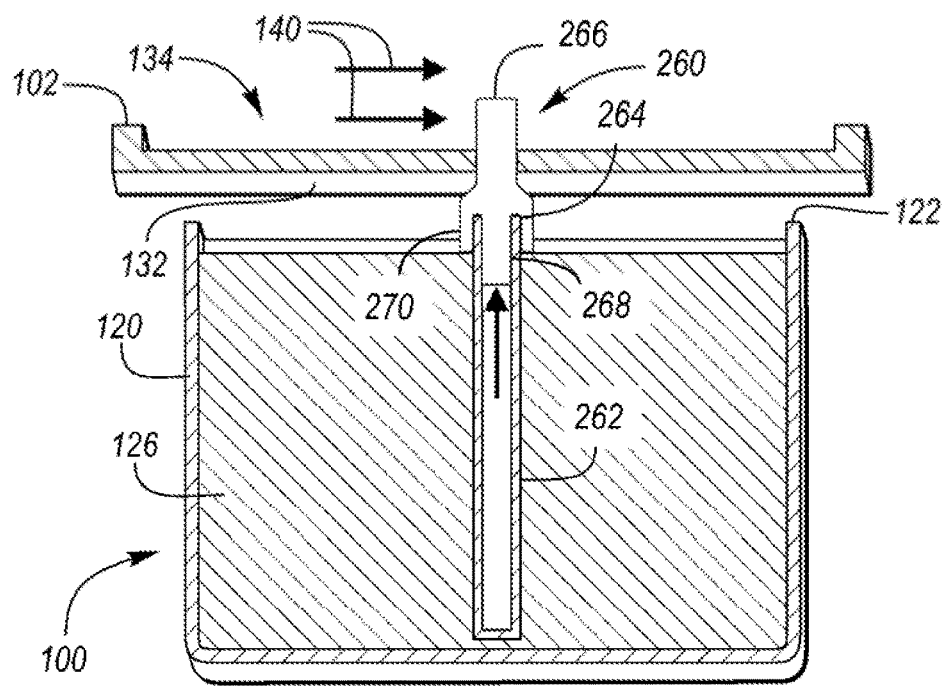
FIG. 13 is a side elevation section view of still another capacitor assembly.

Referring to FIG. 13, in still another approach, a cooling bar 260 may be a multiple component cooling bar. The cooling bar 260 may include a tube portion 262 extending within the potting material 126 and defining a tube tip 264 extending out of the potting material 126. The cooling bar 150 may further include a coolant tip 266 secured to the tube tip 264. The coolant tip 266 may extend through the wall 132 of the power module 102 and into a coolant channel 134 of the power module 102.

The coolant tip 266 may be secured to the tube tip 244 in any suitable manner. In at least one approach, the coolant tip 266 may be secured to the tube tip 264 through an interference fit (e.g., press-fit, snap-fit) engagement. In still another approach, the tube tip 264 and the coolant tip 266 may be provided with complementary threaded regions to permit a threaded engagement between the tube tip 264 and the coolant tip 266.

The coolant tip 266 may similarly be secured to the wall 132 of the power module 102 through an interference fit (e.g., press-fit, snap-fit) engagement. In still another approach, the walls 132 (e.g., at an aperture of the wall 132) and the coolant tip 266 may be provided with complementary threaded regions to permit a threaded engagement between the wall 132 and the coolant tip 266.

As shown in FIG. 13, the coolant tip 266 may have an internal boss or protuberance 268 that may extend into the inner bore of the tube tip 264. The coolant tip 266 may further include an annular skirt disposed that may extend, for example, around an entire outer surface of the tube tip 264. In this way, surface contact between the coolant tip 266 and the tube tip 264 may be increased. As such, a heat transfer between the potting material 126 and the coolant passing through the coolant channel 134 may be improved.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An inverter system comprising:
a power module defining a coolant channel for receiving a coolant;
a capacitor assembly disposed adjacent to the power module, the capacitor assembly including
a housing;

a potting material disposed within the housing;
a plurality of power sources disposed within the potting material; and
a cooling bar extending within the potting material between the power sources, and further extending out of the potting material and into the power module.

2. The inverter system of claim 1 wherein the cooling bar defines a hollow tube extending through a wall of the power module and into a coolant channel of the power module.

3. The inverter system of claim 1 wherein the cooling bar is a multiple component cooling bar including
a tube extending within the potting material and defining a tube tip extending out of the potting material; and
a coolant tip secured to the tube tip, the coolant tip extending through a wall of the power module and into a coolant channel of the power module.

4. The inverter system of claim 1 wherein the cooling bar extends through a wall of the power module and into a coolant channel of the power module, wherein the cooling bar defines a tip portion disposed within the coolant channel, and wherein the tip portion defines a plurality of spaced apart, elongated fins.

5. The inverter system of claim 4 wherein the tip portion defines an array of at least four spaced apart, elongated fins.

6. The inverter system of claim 4 wherein at least a portion of the cooling bar extending within the potting material defines a hollow tube having a first cavity.

7. The inverter system of claim 6 wherein the tip portion defines a hollow tip portion having a second cavity in fluid communication with the first cavity.

8. The inverter system of claim 6 wherein the tip portion is a substantially solid tip portion free of internal cavities.

9. The inverter system of claim 1 wherein the capacitor assembly includes (N−2)/2 cooling bars, and wherein N is a number of power sources disposed within the potting material.

10. An inverter system control module comprising:
a power module adapted to receive a coolant;
a capacitor assembly adjacent the power module, including
capacitor cells disposed within a potting material; and
a cooling bar having
first and second tips extending through a wall of the power module and defining first and second openings; and
a hollow body extending between the first and second tips and at least partially within the potting material.

11. The inverter system control module of claim 10 wherein the first tip is a coolant receiving tip and the second tip is a coolant expelling tip disposed downstream of an expected coolant flow path, and wherein the first and second openings of the first and second tips are adapted to permit fluid communication between a coolant channel of the power module and the hollow body.

12. The inverter system control module of claim 11 wherein the hollow body defines an intake tube portion having a first central axis, an intermediate tube portion having a second central axis angularly offset from the first central axis, and an output tube portion having a third central axis angularly offset from the second central axis and substantially parallel to the first central axis.

13. The inverter system control module of claim 12 wherein the intake tube portion and the output tube portion are disposed in contact with the potting material, and wherein the intermediate tube portion is not in contact with the potting material.

14. The inverter system control module of claim 12 wherein the cooling bar is a multiple discrete component cooling bar, and wherein the first tip is rigidly secured to the intake tube portion and the second tip is rigidly secured to the output tube portion.

15. An electrified vehicle comprising:
a DC power supply configured to provide power for an electric drive system of a vehicle;
an inverter system control (ISC) circuit coupled to, and configured to receive DC power from, the power supply;
wherein the ISC circuit includes
a power module defining a coolant channel for receiving a coolant;
a capacitor assembly disposed adjacent to the power module, the capacitor assembly including
a housing;
a potting material disposed within the housing;
a plurality of power sources disposed within the potting material; and
a cooling bar extending within the potting material between the power sources, and further extending out of the potting material and into the power module.

16. The electrified vehicle of claim 15 wherein the potting material includes a thermally conductive, electrically insulating material.

17. The electrified vehicle of claim 15 wherein the power sources are capacitor cells.

18. The electrified vehicle of claim 15 wherein the capacitor assembly comprises at least one of an input capacitor and a DC-link capacitor.

19. The electrified vehicle of claim 15 wherein the cooling bar is a multiple component cooling bar including
a tube extending within the potting material and defining a tube tip extending out of the potting material; and
a coolant tip secured to the tube tip, the coolant tip extending through a wall of the power module and into a coolant channel of the power module.

20. The electrified vehicle of claim 15 wherein the cooling bar extends through a wall of the power module and into a coolant channel of the power module, wherein the cooling bar defines a tip portion disposed within the coolant channel, and wherein the tip portion defines a plurality of spaced apart, elongated fins.

* * * * *